US008841736B2

(12) United States Patent
Lander

(10) Patent No.: US 8,841,736 B2
(45) Date of Patent: Sep. 23, 2014

(54) INTEGRATED CIRCUIT WITH MEMS ELEMENT AND MANUFACTURING METHOD THEREOF

(71) Applicant: NXP B.V., Eindhoven (NL)

(72) Inventor: Robert James Pascoe Lander, Leuven (BE)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/960,647

(22) Filed: Aug. 6, 2013

(65) Prior Publication Data

US 2014/0042563 A1 Feb. 13, 2014

(30) Foreign Application Priority Data

Aug. 10, 2012 (EP) .................................... 12180166

(51) Int. Cl.
B81B 3/00 (2006.01)
B81C 1/00 (2006.01)

(52) U.S. Cl.
CPC ....... *B81B 3/0018* (2013.01); *B81C 2201/0133* (2013.01); *B81C 2203/0136* (2013.01); *B81C 1/00928* (2013.01); *B81C 1/00134* (2013.01); *B81C 2203/0145* (2013.01)
USPC ........................................................ 257/415

(58) Field of Classification Search
CPC B81B 3/0013; B81B 3/0018; B81C 1/00928; B81C 1/00134; B82Y 15/00
USPC .................................................. 257/414, 415
See application file for complete search history.

(56) References Cited

U.S. PATENT DOCUMENTS 5,772,902 A 6/1998 Reed et al.

OTHER PUBLICATIONS

Kim, C.-J. et al. "Comparative Evaluation of Drying Techniques for Surface Micromachining", Sensors & Actuators A 64, pp. 17-26 (1998).
Extended European Search Report for Patent Appln No. 12180166.6 (Dec. 6, 2012).

Primary Examiner — Whitney T Moore

(57) ABSTRACT

An integrated circuit comprising a MEMS (microelectromechanical system) element in a plane of the integrated circuit, the MEMS element being suspended in a cavity over a substrate, said cavity including a first cavity region in said plane spatially separating an edge of the MEMS element from a wall section, said edge being arranged to be displaced relative to the wall section; and a second cavity region in said plane forming part of a fluid path further including the first cavity region, said fluid path defining a first volume; and a third cavity region in said plane defining a second volume in fluid connection with the second cavity region, wherein the maximum width of the second cavity region is larger than the maximum width of the third cavity region, the second and third cavity regions having maximum widths that are larger than the maximum width of the first cavity region.

15 Claims, 11 Drawing Sheets (d)

INTEGRATED CIRCUIT WITH MEMS ELEMENT AND MANUFACTURING METHOD THEREOF

CROSS-REFERENCE TO RELATED APPLICATIONS

This application claims the priority under 35 U.S.C. §119 of European patent application no. 12180166.6, filed on Aug. 10, 2012, the contents of which are incorporated by reference herein.

FIELD OF THE INVENTION

The present invention relates to an integrated circuit (IC) comprising a MEMS (micro-electromechanical system) element suspended in a cavity over a substrate and an actuator for said MEMS element, wherein said cavity comprises a first region spatially separating the MEMS element from the actuator by a first width.

The present invention further relates to a method of manufacturing such an IC.

BACKGROUND OF THE INVENTION

Surface micro-machining is a technique whereby freestanding and moveable structures are made on top of a substrate using thin film deposition and etching techniques. In this way, both the MEMS element, e.g. a resonator, oscillator, capacitor element, pressure sensitive element and so on, and its package can be processed on top of a substrate such as a silicon wafer. The MEMS element typically has a height of only several thin films measuring about 10 μm in total thickness. Furthermore, surface micro-machining allows for the definition of many thousands of MEMS elements onto a single wafer without making use of expensive assembly steps. This makes MEMS technology a particularly promising technology for miniaturization of functionality on an IC.

The MEMS element may be responsive to an actuator in the IC, e.g. in case of a capacitive MEMS, in which case the measured response of the MEMS element to the actuation signal is translated into a value of a parameter of interest. The MEMS element, which is typically suspended in a cavity over the substrate of the IC, is spatially separated from the actuator by a gap filled with a gas or vacuum, which gap forms a part of the cavity volume. In order to maximize the sensitivity of the MEMS element to the actuation signal, or to maximize the sensitivity of the IC to the detection of the displacement of the MEMS element, this gap should be kept as narrow as possible, as the electrostatic force applied by the actuator on the MEMS element typically scales with $1/W^2$, wherein W is the width of the gap expressed as the distance from the edge of the MEMS element facing the actuator or sensor and the edge of the actuator or sensor facing the MEMS element. For this reason, this gap often forms the narrowest clearance of the MEMS element from the cavity walls.

Such narrow clearances can cause problems in the manufacture of such MEMS elements. Many manufacturing processes rely on one or more wet etching steps to release the MEMS element, i.e. to form the cavity around the MEMS element, which can cause the MEMS element to stick against the cavity walls during subsequent drying steps. This phenomenon is commonly referred to as stiction, and renders the MEMS device non-functional. This problem can be addressed by critical point drying steps, but such techniques are relatively immature and costly.

Moreover, even if stiction problems can be avoided, it has been found by the present inventors that filament formation between the MEMS element and the cavity wall can still occur. An example of such filament formation is shown in FIG. 1, which depicts a scanning electron microscope image of a MEMS element 10 cleared from its surroundings by narrow trench 20 (the actuation gap) and a wider trench 30 providing electrical insulation from its surroundings. In the amplified section of the actuation gap, the formation of filaments bridging the gap can be clearly identified, as further indicated by the arrow.

SUMMARY OF THE INVENTION

The present invention seeks to provide an IC comprising a MEMS element in a cavity that is less prone to such filament formation.

The present invention further seeks to provide a method of manufacturing an IC comprising a MEMS element in a cavity that is less likely to lead to filament formation in the actuation gap.

According to an aspect of the present invention, there is provided an integrated circuit comprising a MEMS (micro-electromechanical system) element (10) in a plane of the integrated circuit, the MEMS element being suspended in a cavity over a substrate, said plane including a first cavity region spatially separating an edge of the MEMS element from a wall section of the cavity, said edge being arranged to be displaced relative to the wall section; and a second cavity region forming part of a fluid path further including the first cavity region, said fluid path defining a first volume; and a third cavity region defining a second volume in fluid connection with the second cavity region, wherein the maximum width of the second cavity portion is larger than the maximum width of the third cavity regions, the second and third cavity regions having maximum widths that are larger than the maximum width of the first cavity region, and wherein at least a part of the second volume is excluded from the fluid path.

The present invention is based on the insight that the filament formation predominantly tends to occur in the narrowest parts of the cavity, i.e. in the narrowest trenches, which indicates that the filament formation is likely to be caused by residues left behind in the cavity when drying the cavity following the cleaning of the cavity with organic solvents such as isopropyl alcohol (IPA). The capillary forces in the narrowest parts of the cavity will cause these parts to resist drying, such that these parts tend to be the last parts of the cavity to dry, which can cause residue accumulation and filament formation.

The present invention is based on the further insight that the provision of a wide second cavity region will trigger the nucleation of a drying front in this region in the plane of e.g. the active material layer, which drying front will progress from the second cavity region to other cavity regions in the plane, thereby forming an increasing void, i.e. a region free of liquid. As part of the third cavity region is separated from the fluid path including the first cavity region and the second cavity region, this void will eventually separate the liquid in the third cavity region from the liquid in the first cavity region, such that contaminants in the third cavity region no longer can reach the first cavity region as the diffusion medium, i.e. the liquid connecting both regions, no longer is present. Consequently, the final contaminant concentration in the first cavity region is reduced, thus reducing filament formation in the first cavity region.

It is noted that instead, filament formation in the third cavity region may occur. However, as long as filament formation in the third cavity region does not significantly affect MEMS performance, e.g. because the third cavity region is located away from the MEMS element or is located along an substantially stationary edge of the MEMS element, this is perfectly acceptable.

In order to prevent a significant portion of the contaminants in the cleaning liquid from reaching the first cavity region, the second volume preferably is larger than the first volume. For the same reason, the majority of the second volume preferably is excluded from the fluid path. More preferably, the whole of the second volume is excluded from the fluid path.

In an embodiment, the first cavity region extends from the second cavity region, and the third cavity region is fluidly connected to the second cavity region via a channel portion having a width not exceeding the width of the first cavity portion. This ensures that the void formation progresses in a direction away from the channel portion, such that the contaminants in the third cavity region are excluded from the first cavity region almost immediately after the void formation in the second cavity region, thus minimizing the amount of contaminants that can diffuse from the third cavity region to the first cavity region once the drying process has started.

In an embodiment, the plane further includes a plurality of channels extending from the first cavity region into the cavity wall section, each of said channels having a channel width that does not exceed the width of the first cavity region. The narrow channels act as sinks for the residues, such that the risk of filament formation in the actuation gap is further reduced.

In accordance with another aspect of the present invention, there is provided an integrated circuit comprising a MEMS (microelectromechanical system) element formed in a material layer over a substrate and suspended in a cavity; a capping layer over the cavity, said capping layer comprising a plugged vent hole, wherein the cavity comprises a first cavity region spatially separating an edge of the MEMS element from a wall section of the cavity, said edge being arranged to be displaced relative to the wall section; a first further region in between the MEMS element and the substrate; and a second further region located in part in between the MEMS element and the capping layer, said second further region comprising a first section in between the MEMS element and a part of the capping layer including the plugged vent hole; and a second section in between an unreleased portion of the material layer and a further part of the capping layer not including a plugged vent hole, wherein the first section is separated from the second section by a channel portion having a width not exceeding the maximum width of the first cavity region.

In this alternative embodiment, a contaminant reservoir, i.e. the second section, with a preferably large volume is provided over an unreleased portion of the active material layer which is connected to the rest of the cavity and the one or more vent holes via a narrow channel. The location of the vent hole in connection with the first section will trigger void formation in the first section in the initial stages of the drying process, whereas the capillary forces in the narrow channel will prevent the second section from drying at the same time. Hence, the void formation will separate the contaminated liquid in the second section from the first channel region, such that the overall contaminant concentration in the first channel region at the end of the drying process will have been reduced, thus reducing the risk of filament formation in this region.

In accordance with another aspect of the present invention, there is provided a method of manufacturing an integrated circuit comprising a MEMS element suspended in a cavity, the method comprising providing a first sacrificial material layer on a substrate; providing an active material layer on the first sacrificial material layer; patterning the active material layer to form the MEMS element, a first cavity region spatially separating an edge of the MEMS element from a wall section of the cavity, said edge being arranged to be displaced relative to the wall section; a second cavity region forming part of a fluid path further including the first cavity region, said fluid path defining a first volume; and a third cavity region defining a second volume in fluid connection with the second cavity region, wherein the maximum width of the second cavity portion is larger than the maximum width of the third cavity regions, the second and third cavity regions having maximum widths that are larger than the maximum width of the first cavity region, and wherein at least a part of the second volume is excluded from the fluid path; forming a part of the cavity by partially removing the first sacrificial material layer through the patterned active material layer using a first etch recipe; forming a second sacrificial material layer over the patterned active material layer; forming a capping layer over the second sacrificial material layer, said capping layer comprises at least one opening; and completing said cavity by removing the second sacrificial material layer through the at least one opening using a wet etch recipe.

The IC of the present invention can be manufactured in a straightforward manner by adjusting the patterning of the active material layer to form the channel portions in the trenches surrounding the MEMS portion. Hence, no additional processing steps are required to improve the reliability of the MEMS of the IC by the reduction of the risk of filament formation in e.g. the actuation gap.

In an alternative aspect of the present invention, there is provided a method of manufacturing an integrated circuit comprising a MEMS element suspended in a cavity, the method comprising providing a first sacrificial material layer on a substrate; providing an active material layer on the first sacrificial material layer; patterning the active material layer to form the MEMS element, a first cavity region spatially separating an edge of the MEMS element from a wall section of the cavity, said edge being arranged to be displaced relative to the wall section; forming a part of the cavity by partially removing the first sacrificial material layer through the patterned active material layer using a first etch recipe; forming a second sacrificial material layer over the patterned active material layer; patterning the second sacrificial material layer to define a first section on the MEMS element, a second section on an unreleased portion of the material layer and a channel portion connecting the first section to the second section, the channel portion having a thickness not exceeding the maximum width of the first cavity region; forming a capping layer over the second sacrificial material layer, said capping layer comprises at least one opening over the first section; and completing said cavity by removing the second sacrificial material layer through the at least one opening using a wet etch recipe.

The IC of the present invention can be manufactured in a straightforward manner by adjusting the patterning of the second sacrificial material layer to form a contaminants reservoir over the active material layer. In this case, a single additional processing step suffices to improve the reliability of the MEMS of the IC by the reduction of the risk of filament formation in e.g. the actuation gap.

In an embodiment, in said methods the patterning step further comprises defining a plurality of channels extending from the first cavity region into said wall section, each of said channels having a channel width that does not exceed the maximum width of the first cavity region. This further reduces the risk of filament formation in the actuation gap without requiring additional processing steps to release the MEMS element.

The methods may further comprise cleaning the cavity by rinsing the cavity with a solvent such as isopropyl alcohol; and subsequently drying the cavity to remove etch residues from the cavity. Due to the presence of the channel portions, the risk of filament formation in the actuation gap during said drying step is significantly reduced. The cleaning step may further comprise rinsing the cavity with water prior to the drying step.

BRIEF DESCRIPTION OF THE EMBODIMENTS

Embodiments of the invention are described in more detail and by way of non-limiting examples with reference to the accompanying drawings, wherein.

Figure 3:
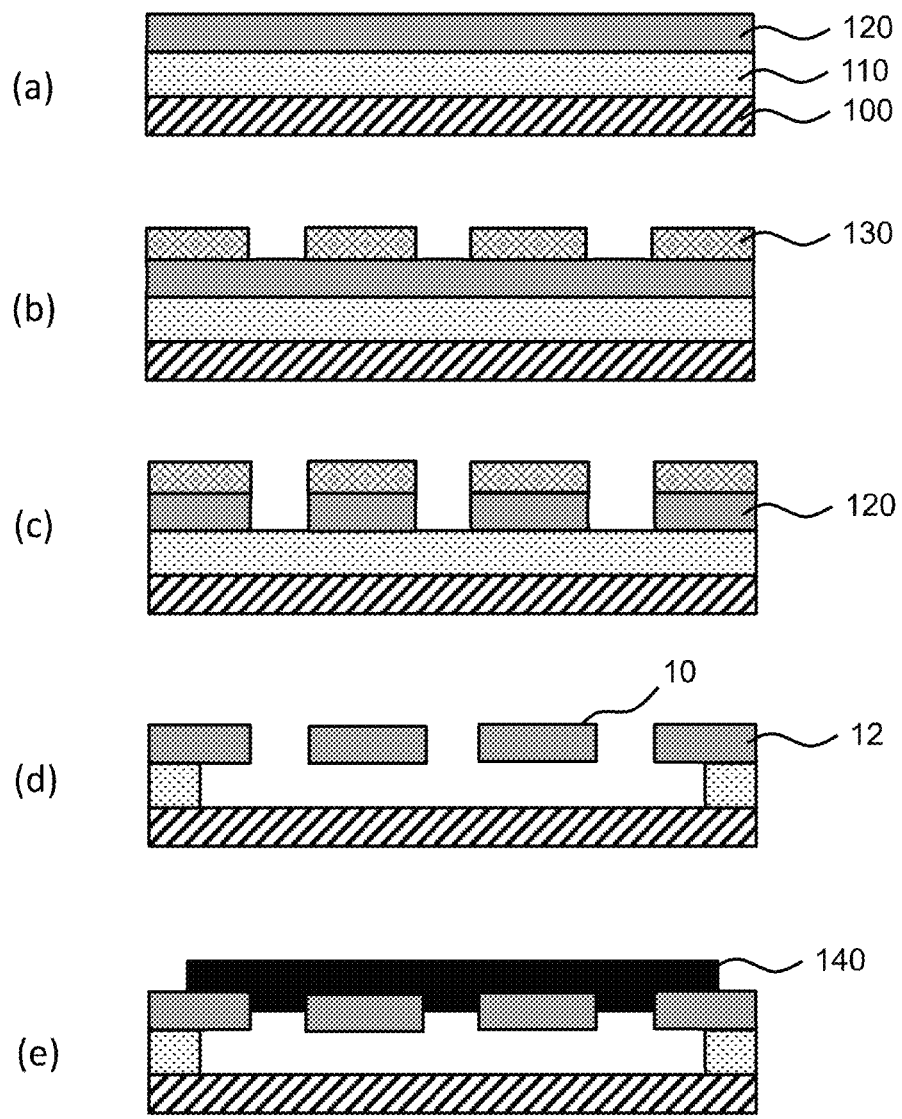
Figure 3:
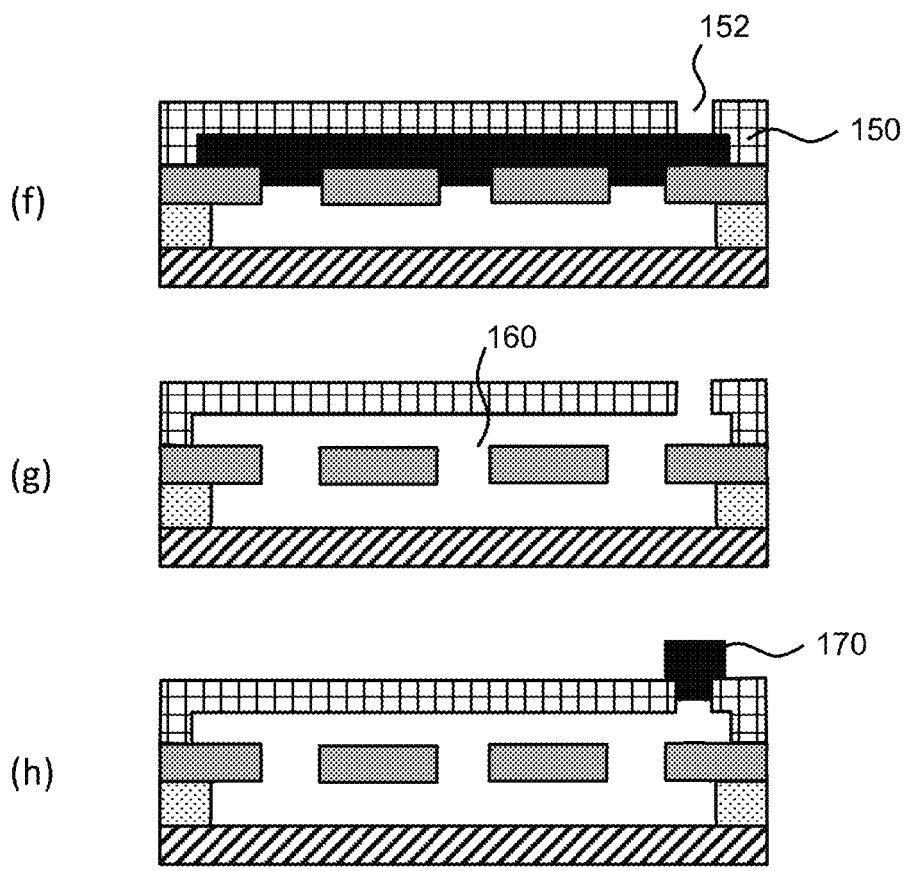
Figure 4:
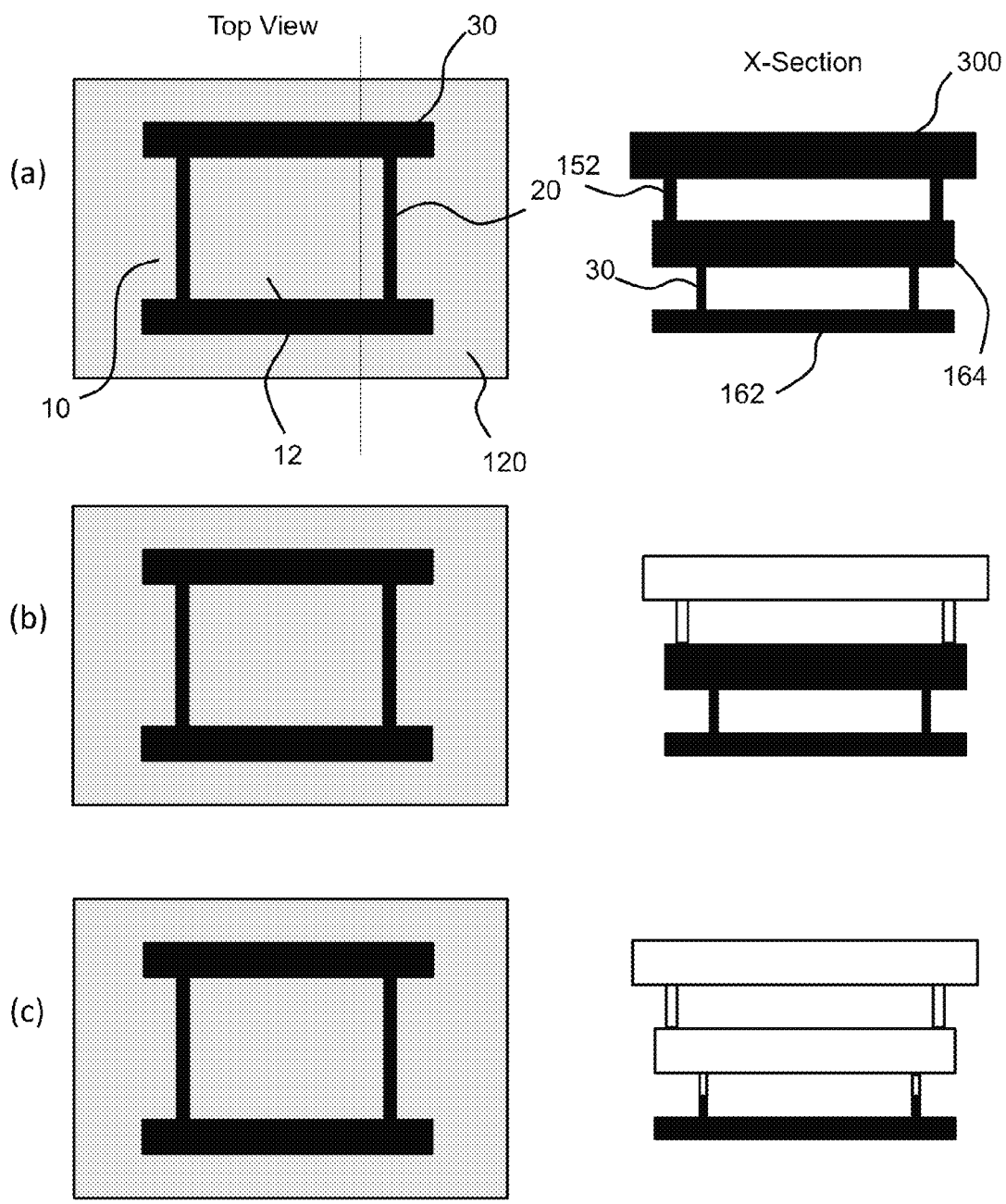
Figure 4:
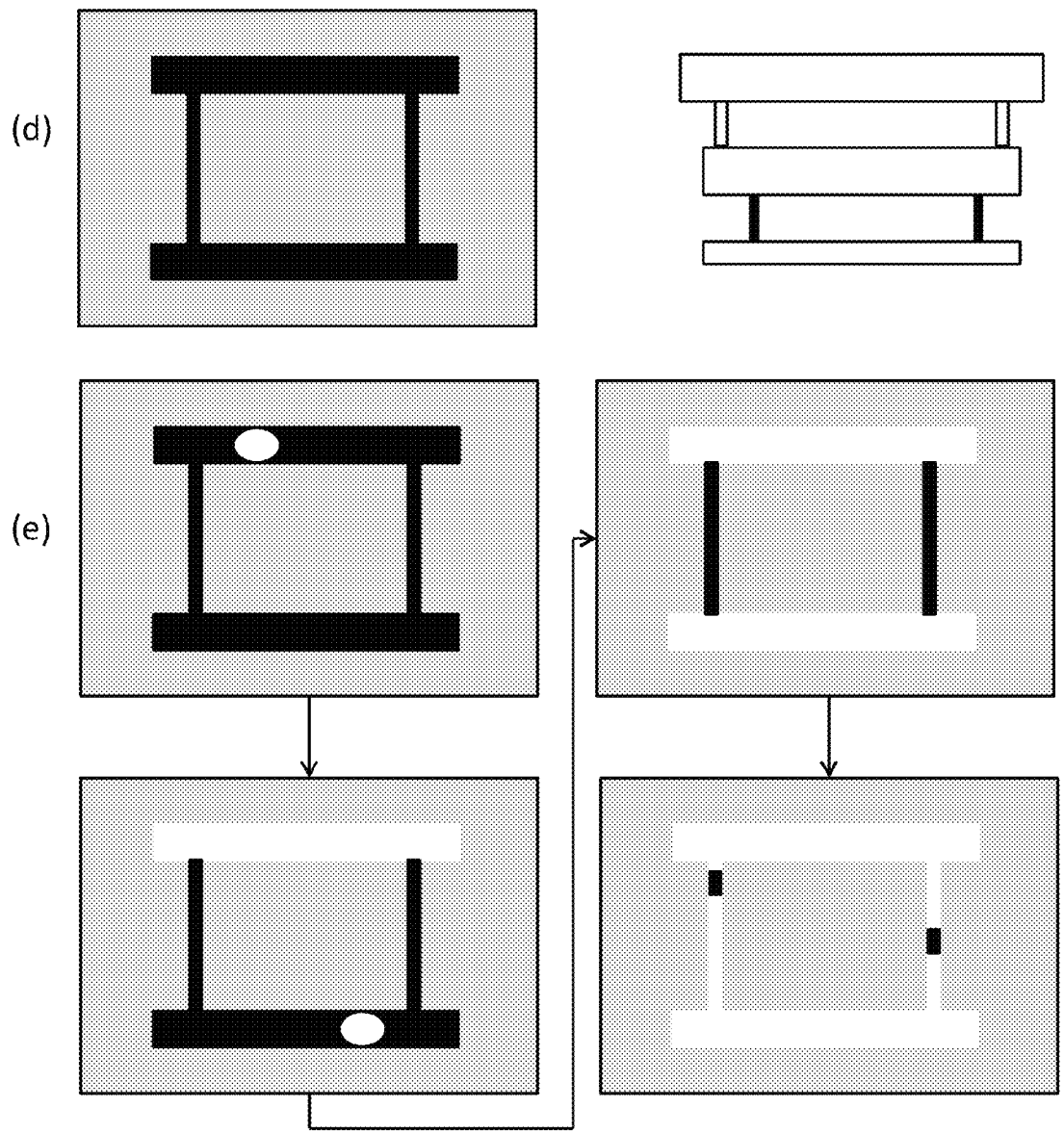
Figure 5:
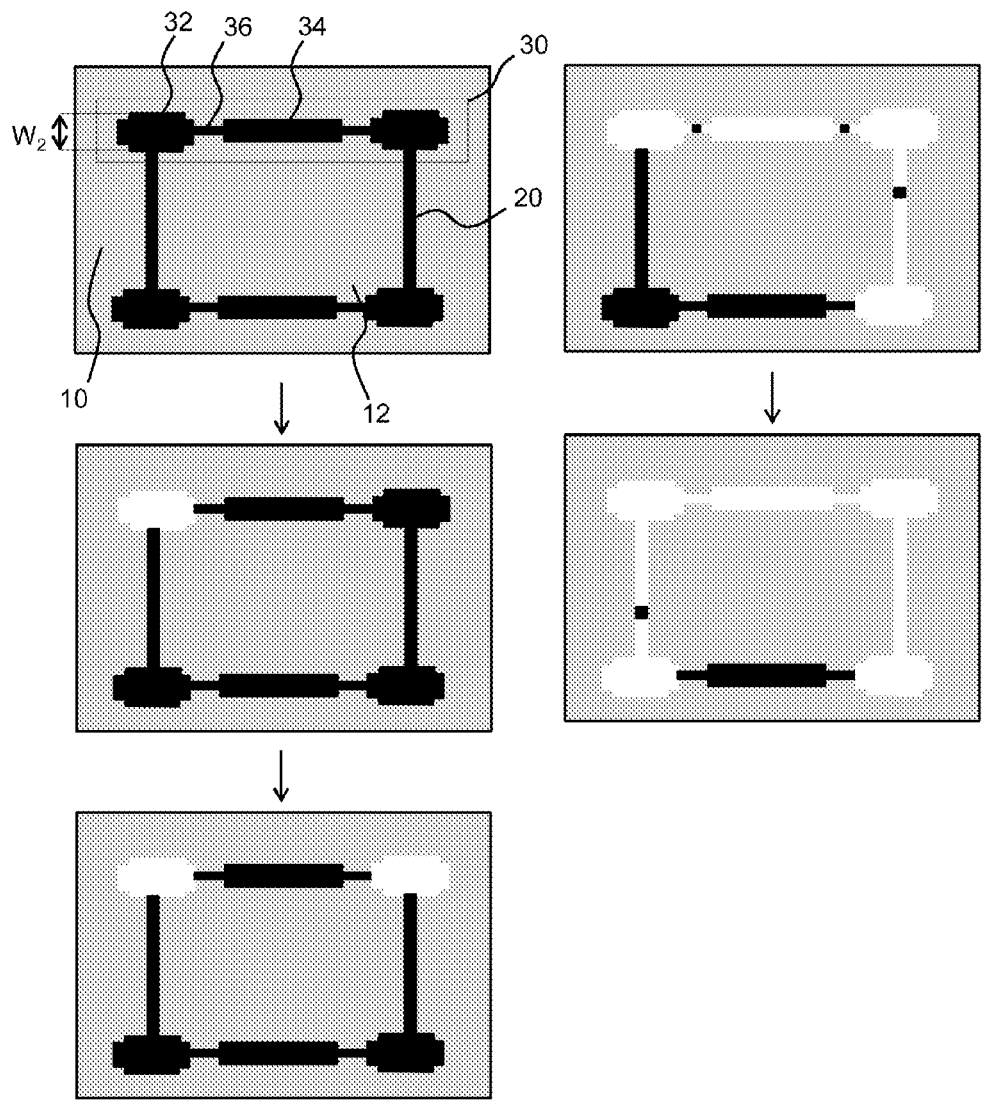
Figure 6:
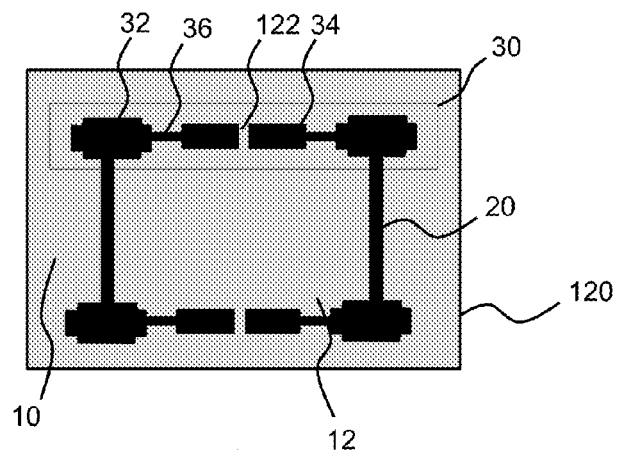
Figure 7:
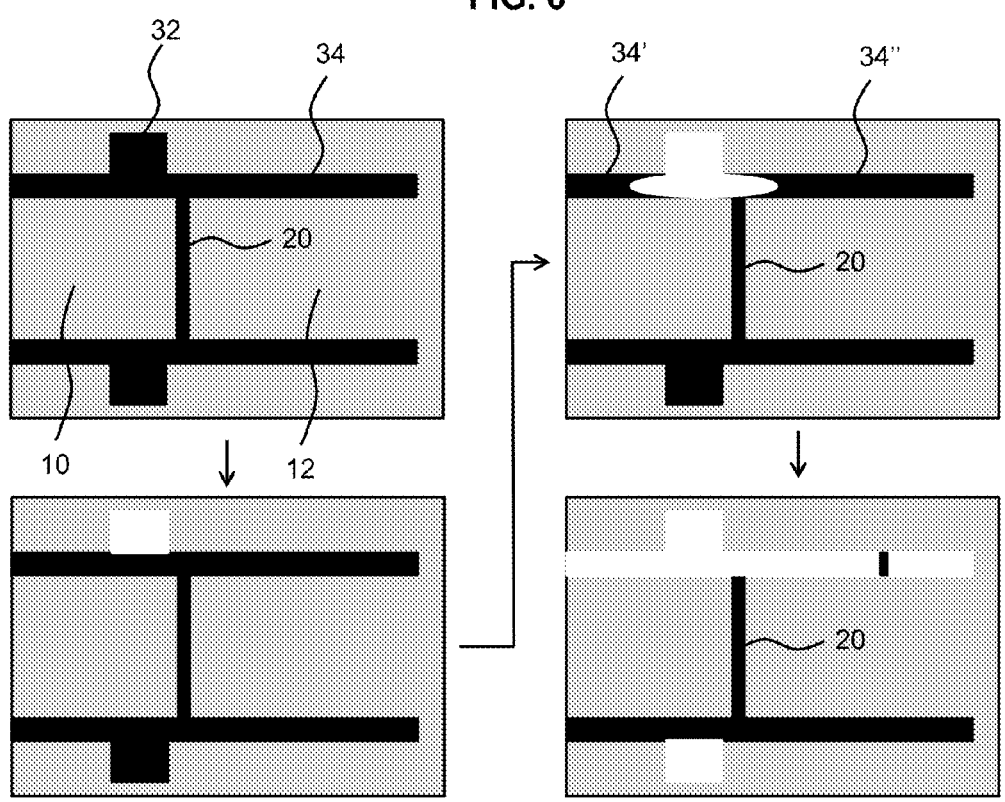
Figure 8:
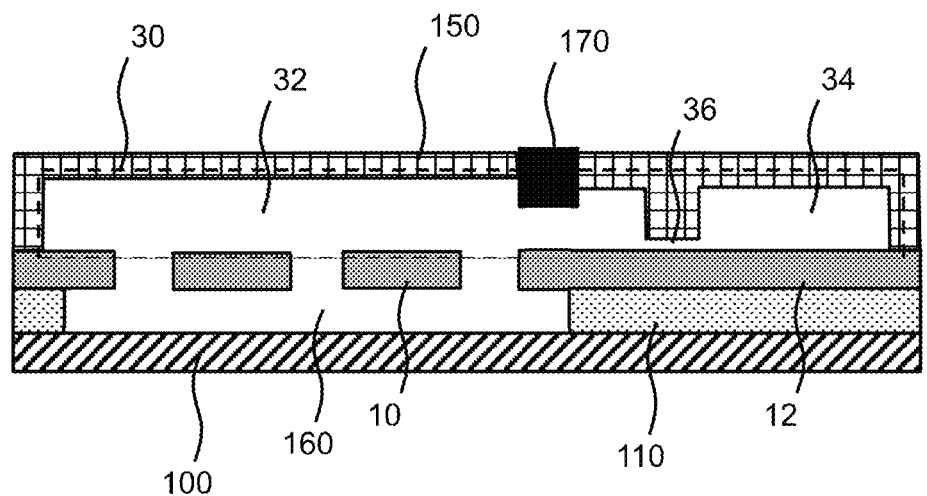
Figure 9:
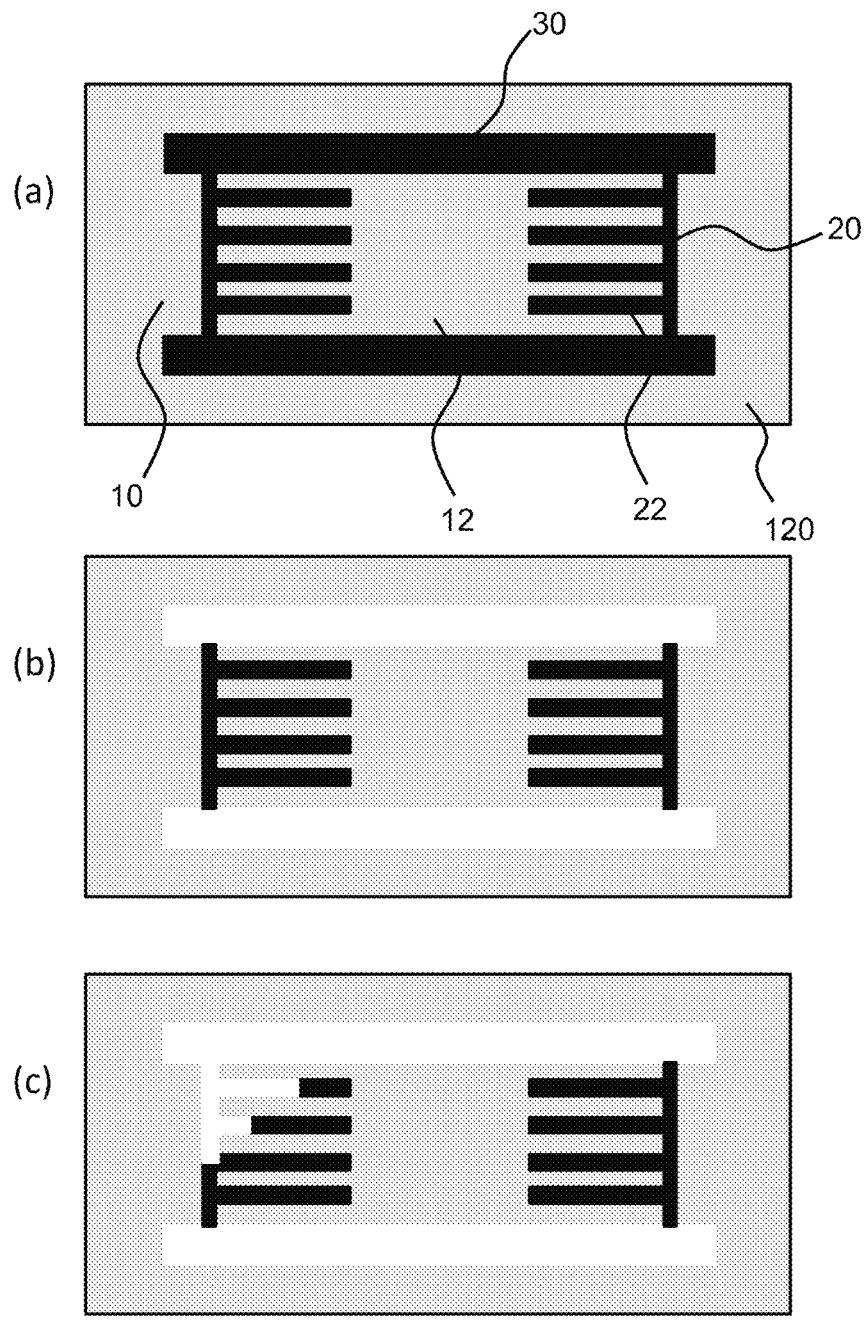
Figure 9:
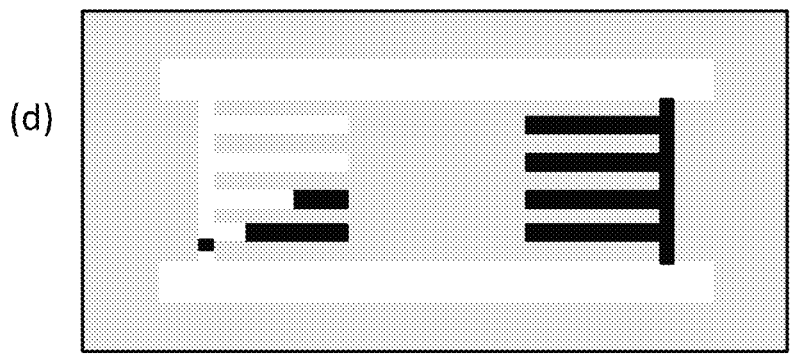
Figure 10:
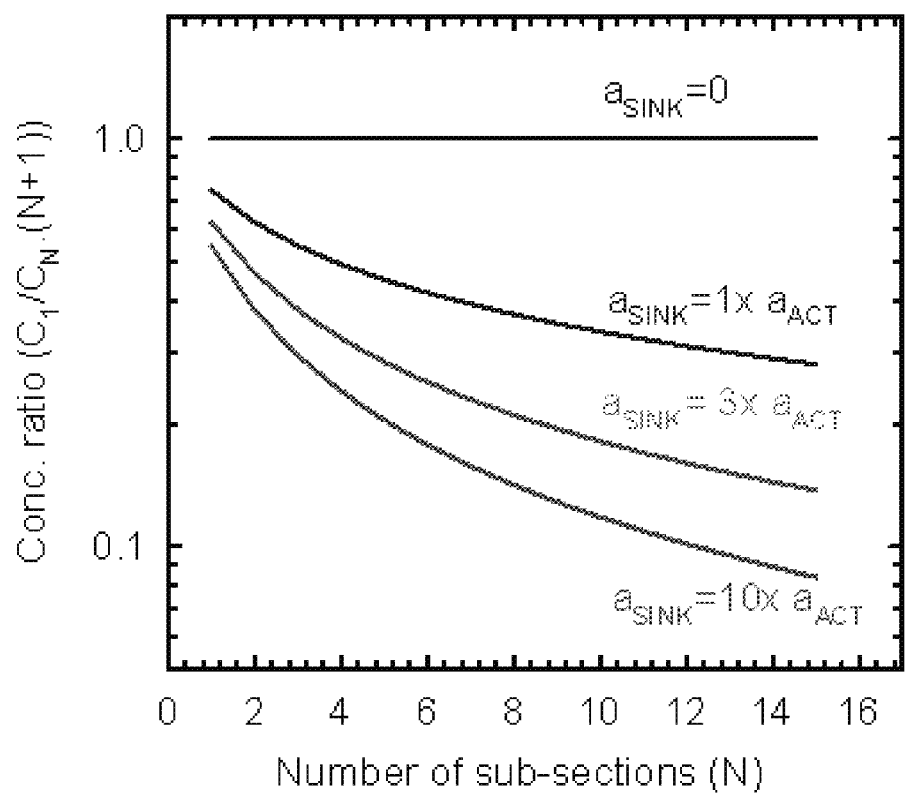
Figure 11:
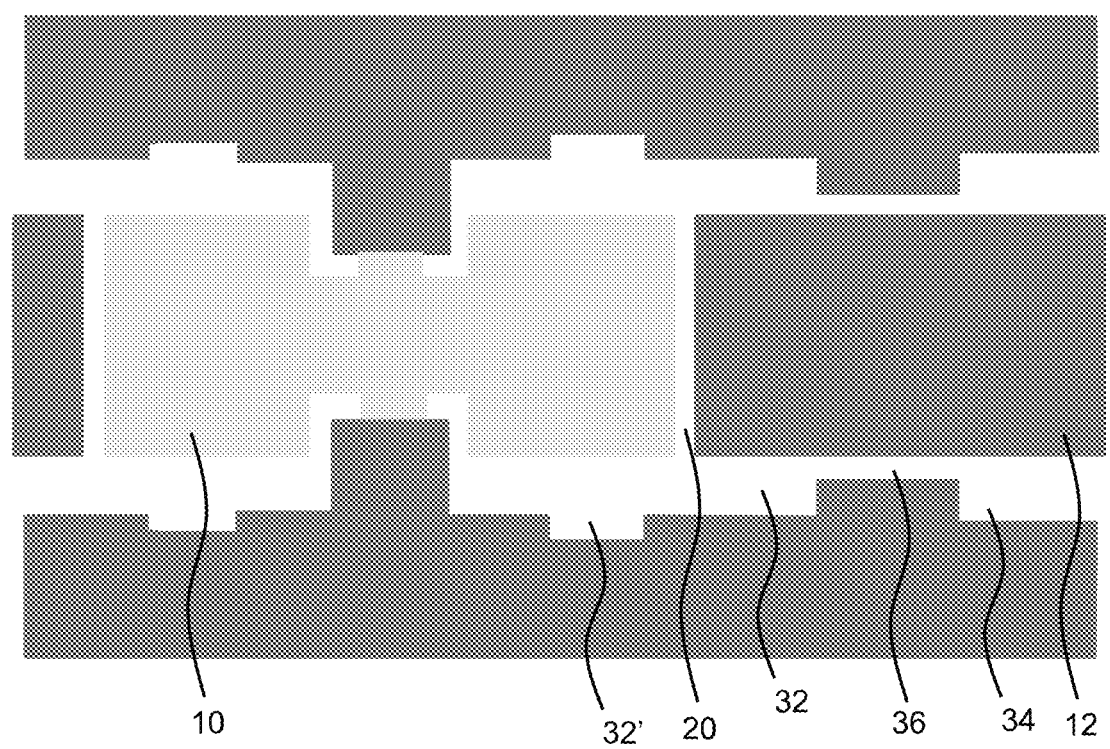

FIG. 3 schematically depicts a manufacturing method of an IC comprising a MEMS element;

FIG. 4 schematically depicts a drying sequence of a prior art IC comprising a MEMS element;

FIG. 5 schematically depicts a drying sequence of an IC comprising a MEMS element according to an embodiment of the present invention;

FIG. 6 schematically depicts a non-limiting example design aspect of an IC comprising a MEMS element according to an embodiment of the present invention;

FIG. 7 schematically depicts a drying sequence of an IC comprising a MEMS element according to another embodiment of the present invention;

FIG. 8 schematically shows an aspect of an IC according to another embodiment of the present invention;

FIG. 9 schematically depicts a drying sequence of an IC comprising a MEMS element according to yet another embodiment of the present invention;

FIG. 10 depicts the simulation results of a final contamination level in the actuator gap as a function of the number of channels extending from a first cavity region such as an actuator gap; and FIG. 11 schematically shows a design aspect of an IC according to an embodiment of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

In the context of the present invention, a cavity region is a portion of the cavity in a particular segment or plane of the cavity. For instance, a cavity region in the plane of an active material layer is a region that has is located in between the upper plane and lower plane of an active material layer in which a MEMS element is defined. A cavity region is delimited by an active material layer wall portion, a junction with another cavity region or a combination of both. A cavity region is delimited from another cavity region by the presence of a non-linear junction between the two cavity regions or a channel that connects the two cavity regions. A channel is a conduit between two adjacent cavity regions that is narrow enough to exhibit non-negligible capillary forces in the presence of a liquid in the channel. The width of a channel is significantly less than the width of any of the two cavity regions, e.g. no more than 20% or 10% of the minimum width of the cavity regions.

Where reference is made to the width of a cavity region, this width is defined as the distance between opposing delimiting edges of the cavity portion. The width of a cavity region does not exceed the length of a cavity region.

In the present invention, any void that is fluidly connected to the cavity is considered to form part of the cavity. This for instance includes trenches etched into a section of the active material layer that is not released from the underlying substrate, e.g. because the sacrificial material separating this section from the substrate is not removed.

Figure 1:
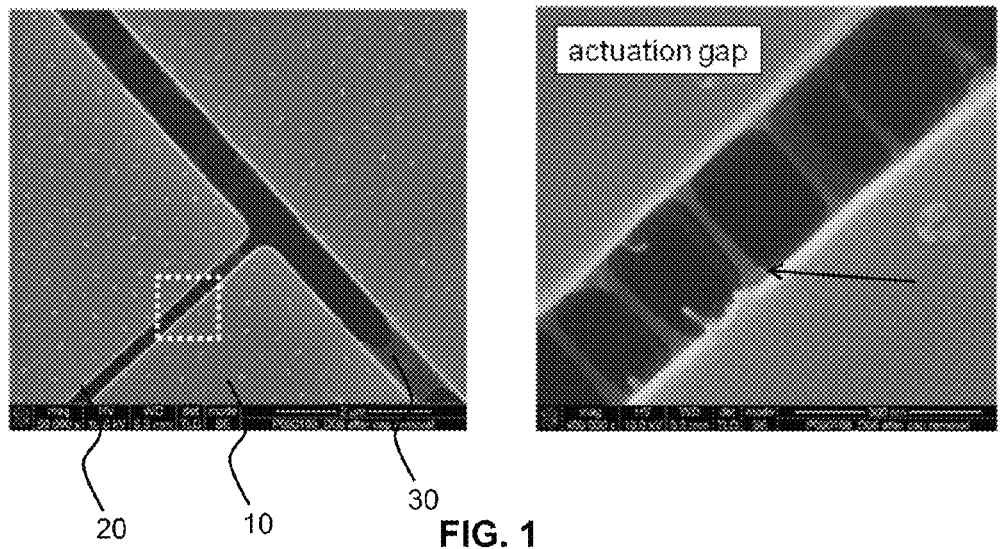
FIG. 1 shows a SEM image of an aspect of a MEMS element suffering from filament formation.
Figure 2:
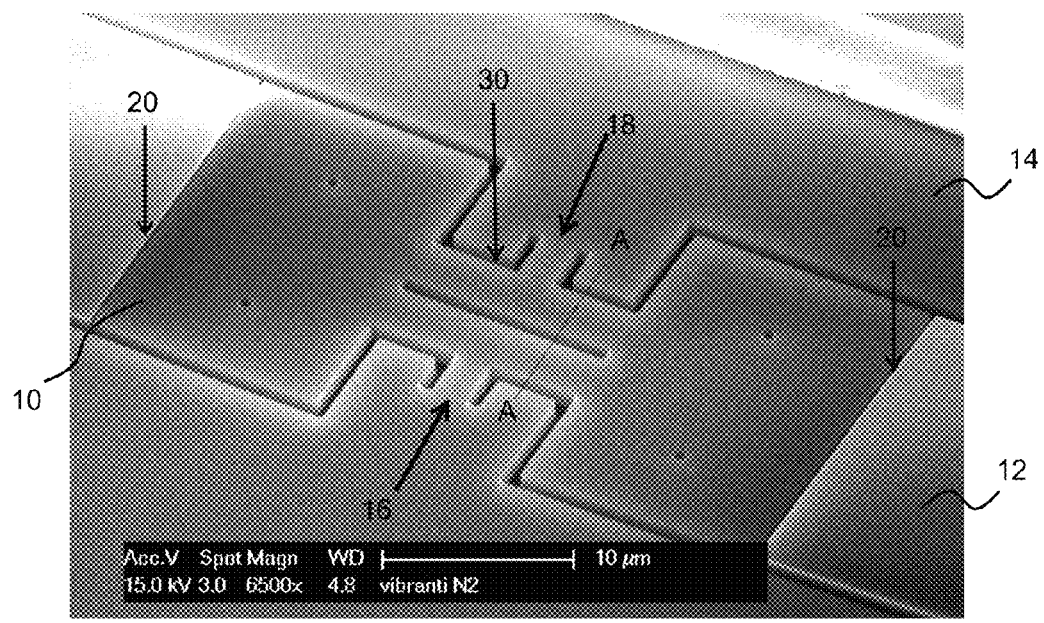
FIG. 2 shows a SEM image of an aspect of an IC comprising a MEMS element.

A non-limiting example of a MEMS device is shown in FIG. 2, which shows a top view of a dog bone resonator MEMS element 10 released from the layer in which it is formed by trenches 20 and 30. The trench 20 separates the MEMS element 10 from a portion 12 of the IC, whereas the trench 30 separates the MEMS element 10 from a portion 14 of the IC. The trenches 20 and 30 allow the release of a sacrificial material underneath the MEMS element 10, thereby releasing the MEMS element 10 from the underlying substrate.

The MEMS element 10 is typically suspended in the thus formed cavity by one or more anchoring structures. In FIG. 2, two anchoring structures 16 and 18 are shown by way of non-limiting example. Such anchoring structures may play an active or passive role in the operation of the MEMS element 10. In case of a passive role, the anchoring structures are simply anchoring the MEMS element in its cavity. In case of an active role, e.g. as is the case in the dog bone resonator MEMS element 10 of FIG. 2, a signal, e.g. a (direct) current $I_0$ may be applied to the MEMS element 10 via anchoring input structure 16, with one or more (gate) electrodes 12 applying a gate voltage $V_{g0}$ to the dog bone resonator MEMS element 10 across the actuation trench 20, which becomes modulated with the resonance frequency of the resonator such that the anchoring output 18 can be read out in a piezoresistive manner, given that the output voltage can be expressed as $V_{out} = I_0(R + \Delta R)$, in which $\Delta R$ is the variable resistance component caused by the in-plane oscillation of the dog bone resonator MEMS element 10.

The operating principle of such a resonator is explained in more detail in an on-line publication "56 MHz Piezoresistive Micromechanical Oscillator" By J. J. M. Bontemps et al., which was retrieved from the Internet at http://www-.memsland.nl/publications/publications %202009/ Bontemp_Transducers2009.pdf on Thursday 19 Jul. 2012.

It should however be understood that the present invention is not limited to a particular type of MEMS element 10, as this type has no significant bearing on the principles of the present invention. For instance, whereas in FIG. 2 a device is shown exhibiting an in-plane oscillation mode, it is equally feasible to have a device exhibiting out-of-plane oscillation behaviour. Equally, although in FIG. 2 the sensing output 18 and actuator 14 are configured in a perpendicular orientation, it is equally feasible to adopt a linear arrangement of these elements. The MEMS does not have to be a resonator, but may be any suitable type of MEMS. Other obvious variations will be immediately apparent to the skilled person.

Various design considerations play a role in choosing the dimensions of the cavity regions, e.g. trenches 20 and 30 for releasing the MEMS element 10. From a manufacturability perspective, it may for instance be desirable that the trenches 20 and 30 have the same width, as this provides good control over the etch process for releasing the MEMS element 10. On the other hand, in case of a side of the MEMS element facing a region 12 of the IC for interacting with the MEMS element 10, e.g. a gate electrode or sensing element for measuring or invoking the displacement of the MEMS element 10 relative to the edge or wall of the region 12, the trench 20 should be kept as narrow as possible, as previously explained.

At the same time, if part of the trench 30 separates the MEMS element 10 from a part 14 of the IC that is not intended to interact with the MEMS element 10, it may be advantageous to increase the width of the trench 30 in order to limit the magnitude of a parasitic capacitance across the trench 30, and/or to increase access to the underlying sacrificial layer such that the MEMS element 10 can be released more quickly.

Design rules may limit the maximum width of the trench 20 and 30, for instance when a sacrificial layer is to be formed over the MEMS element 10 to facilitate the formation of a capping layer, as will be explained in more detail below. In such a case, the width of the trenches is limited by the design rule to preventingress of the sacrificial material into the trenches 20, 30 or the cavity formed underneath the MEMS element 10.

Hence, it should be understood that many different dimensions for the trenches 20, 30 may be chosen based on design considerations. However, the IC will typically comprise at least one trench that is chosen to be as narrow as possible to maximize the sensitivity of the MEMS, because the trench separates a region of the IC for manipulating or sensing the displacement of the MEMS element 10. Such a narrow trench is particularly prone to filament formation across the trench as previously explained. The present invention provides a set of design rules for the trench dimensions, or more generally, for the layout of the various parts of the cavity in which the MEMS element 10 is suspended, to reduce the risk of such filament formation.

An example process flow for manufacturing an IC comprising a MEMS as shown in FIG. 2 is shown in FIG. 3. The various steps of FIG. 3 schematically depict the cross-sections across the line A-A in FIG. 2. In step (a), a substrate 100 is provided, which may be any suitable type of substrate, e.g. an insulating substrate, a silicon substrate, a SiGe substrate and so on, onto which a first sacrificial material layer 110 is deposited or formed, such as an oxide layer, e.g. $SiO_2$. An active material layer 120, e.g. a silicon layer, is deposited or grown over the first sacrificial material layer 110. In an embodiment, the combined structure comprises a silicon on insulator substrate, which may be provided as a single structure.

In step (b), a mask 130, e.g. a patterned resist, is formed on the active material layer 120, which defines the various structures to be formed in the active material layer 120, such as the MEMS element 10 and the trenches 20 and 30. The mask 130 may be formed in any suitable manner. Next, the portions of the active material layer 120 that are exposed through the mask 130 are removed, e.g. using a suitable etch recipe that terminates on the first sacrificial material layer 110, as shown in step (c).

Next, part of the first sacrificial material layer 110 is selectively removed through the patterned active material layer 120, e.g. using an etch recipe that has a high selectivity for the first sacrificial material, as shown in step (d). This releases the MEMS element 10. A portion of an actuator 12, e.g. a gate electrode, or a sensing element for the MEMS element 10 is also shown for the sake of completeness.

A second sacrificial material layer 140 is subsequently deposited or otherwise formed over the resultant structure. A particularly suitable material is aluminium, as this can be deposited with high conformality, thus avoiding excessive contamination of the void created by the selective removal of the first sacrificial material layer 110. This is shown in step (e). As previously explained, design rules may be in place to limit the maximum width of the trenches 20 and 30 to avoid ingress of the second sacrificial material.

The method subsequently proceeds to step (f), in which a capping layer 150 is deposited or otherwise formed over the second sacrificial material layer 140, such as a silicon nitride layer or a layer of another suitable capping material. The capping layer includes one or more openings, i.e. vent holes, 152 for releasing the second sacrificial material.

Next, the second sacrificial material is selectively removed from the IC as shown in step (g). This is typically achieved using a suitable wet etch recipe having a high selectivity for the second sacrificial material. This step forms the cavity 160 in which the MEMS element 10 is suspended. As will be immediately apparent to the skilled person, the patterned active material layer 120 typically further comprises one or more anchoring structures that anchor or suspend the MEMS element 10 inside the cavity 160, but these anchoring structures are not explicitly shown for the sake of brevity.

The cavity 160 is subjected to a sequence of cleaning steps, which will be explained in more detail later, after which the desired atmosphere is formed in the cavity 160 and the cavity 160 is sealed by plugging the openings 152 using a suitable sealing material, e.g. a metal such as aluminium, as shown in step (h).

When cleaning the cavity 160, e.g. to remove residues from the one or more wet etching steps, the cavity 160 is typically subjected to one or more rinsing cycles, after which the cavity 160 is dried prior to the sealing of the openings 152. Due to the fact that the cavity 160 is typically formed by a number of different sections having different dimensions, e.g. the voids formed by the removal of the first and second sacrificial materials and the trenches formed in the active material layer 120 to release the MEMS element 10 from the remainder of the active material layer 120, the drying process exhibits distinct stages in which different parts of the cavity 160 become dry at different points in time. This is schematically depicted in FIG. 4 for a prior art IC.

The left hand panes of FIG. 4 depict a top view of the active material layer 120 including the MEMS element 10, a first region 20 of the cavity 160 that defines the gap between the MEMS element 10 and an unreleased portion of the active material layer 120, which faces a moving edge of the MEMS element 10 and for instance may be arranged to interact with the MEMS element 10, e.g. may define or comprise a gate electrode or sensing electrode 12, and a second region 30 of the cavity 160 that provides sufficient clearance between the MEMS element 10 and the portion 12 at the one hand and the remainder of the active material layer 120 on the other hand. In FIG. 4, the remainder of the active material layer 120 is not designed to interact with the MEMS element 10, such that the trench 30 typically is wider than the trench 20 to provide access to the first sacrificial material 110 and provide electrical insulation as previously explained.

In the top view panes in FIG. 4, the trench 30 is shown in a truncated form of clarity reasons only. It should be understood that the trench 30 typically extends along a substantial part of the MEMS element 10, e.g. the trench 30 may terminate at one of the anchoring regions 16, 18.

The right hand panes of FIG. 4 depict a cross-section (X-section) of the IC along the dashed line in the left hand pane of FIG. 3(a). A liquid bath 300 is connected to the cavity 160 via vent holes 152. Also shown are the lower region 162 of the cavity 160 formed by the removal of the first sacrificial material 110 and the upper region 164 of the cavity 160 formed by the removal of the second sacrificial material 140, with the lower region 162 and the upper region 164 being interconnected via the first region, i.e., actuation gap, 10 and the second region, i.e., isolation trench, 20 in the active material layer 120.

In FIG. 4 and subsequent figures, the presence of a liquid in the cavity 160 or liquid bath 300 is shown in black. The absence of a liquid in the cavity 160 or liquid bath 300 is shown in white.

Step (a) shows the situation at the end of a cleaning cycle immediately prior to drying, in which the cavity 160 may have been rinsed with a number of cleaning or rinsing liquids. At this stage, although the etch residues may have been sufficiently removed from the cavity 160, the liquid in the cavity 160 will nevertheless still contain a concentration of unwanted residues, the origin of which may be difficult to control or even determine. For instance, even in a clean room environment, it may be practically unfeasible to prevent diffusion of contaminants into the rinsing liquid, or indeed the rinsing liquid itself may comprise a certain concentration of contaminants. It may also be difficult to effectively remove all etch residues from the rinsing liquids as this may require unfeasibly high dilution. It should be understood that the present invention is not concerned with the exact origin of these contaminants, as the present invention is not directed to the prevention of such contaminants or residues occurring in the rinsing liquids.

At point (a) in FIG. 4, the residue concentration in the rinsing liquid may be expressed as $C_0$, assuming that same concentration is obtained throughout the cavity 160 and the liquid bath 300. The exact value $C_0$ will depend on whether this concentration is diffusion-limited, i.e. higher amounts of rinsing liquid will reduce the concentration by further dilution, or whether this concentration is supply-limited, i.e. whether a dynamic equilibrium is formed between the source of the contamination and the rinsing liquid.

The drying process commences by the removal of the liquid bath 300, which is shown in step (b) as the liquid bath 300 becoming dry. In case of supply-limited contamination, the residue concentration $C_1$ in the liquid remaining in the cavity 160 will be $C_1=C_0$. In case of diffusion-limited contamination, the residue concentration $C_1$ in the liquid remaining in the cavity 160 will increase, i.e. $C_1 > C_0$, with $C_1$ being a function of the drying time and temperature, i.e. $C_1(t_1, T_1)$.

Upon further drying, the upper region 164 of the cavity 160 will become dry first. This reduces the overall volume of the liquid in the cavity 160, which therefore increases the contaminant concentration in the remaining liquid, as the contaminants are now 'locked into' the cavity 160, i.e. the amount of contaminants can now be considered constant, such that from here on changes in contaminant concentration will be diffusion-limited. Consequently, the new contaminant concentration $C_2$ in the liquid can be expressed as $C_2=C_0 \cdot V_{160}/(V_{160}-V_{164})$ in case of the supply-limited model and as $C_2=C_1(t_1, T_1) \cdot V_{160}/(V_{160}-V_{164})$ in the diffusion-limited model, in which $V_{160}$ and $V_{164}$ are the respective volumes of the cavity 160 and the upper portion 164 of the cavity 160.

In step (d), the lower portion 152 is the next portion of the cavity to become dry. This is because the liquid that is removed from the trenches 20 and 30 in the active material layer 120 is immediately replenished by the liquid in the lower portion 152 of the cavity 150, at least in part due to the capillary forces that exist in the relatively narrow trenches 20 and 30. Consequently, the new contaminant concentration $C_3$ in the liquid can be expressed as $C_3=C_0 \cdot V_{160}/(V_{160}-V_{162}-V_{164})$ in case of the supply-limited model and as $C_2=C_1(t_1, T_1) \cdot V_{160}/(V_{160}-V_{162}-V_{164})$ in the diffusion-limited model, in which $V_{162}$ is the volume of the lower portion 162 of the cavity 160.

In a final step, the cavity regions 20 and 30 in the plane of the active material layer 120 will become dry. This is shown in step (e), which shows the top views of the various stages of this drying process. First, the wide trenches 30 will start to dry, as the larger width of these trenches corresponds to a smaller capillary force therein compared to the capillary forces that exist in the narrow actuation gap or trench 20. This is indicated by the void formation in the first and second top views in the sequence of top views in step (e).

At this point, it is noted that under quasi-static conditions, any redistribution of the liquid (driven by evaporation) will occur where dE/dV is at a minimum, i.e. most negative, value, wherein E is the total surface energy of the connected liquid and V is the total liquid volume.

For two voids to form simultaneously, this requires that dE/dV be continuously and simultaneously identical and at a minimum at both void locations. This is highly unlikely, and for this reason the drying process of a region of the cavity typically is driven by single void formation.

After the drying of the wide trenches 30, the new contaminant concentration $C_4$ in the liquid can be expressed as $C_3=C_0 \cdot V_{160}N_{20}$ in case of the supply-limited model and as $C_2=C_1(t_1, T_1) \cdot V_{160}/V_{20}$ in the diffusion-limited model, in which $V_{20}$ is the volume of the actuation gap 20 of the cavity 160.

Finally, the cavity region defining the actuation gap or trench 20 will dry, which will lead to the formation of droplets of the rinsing liquid bridging the gap between the MEMS element 10 and the opposite wall of the cavity 160. The maximum concentration in the droplet may be expressed as:

$$C_{max} = \frac{A_{20}}{2 \cdot V_{min} A_{30}} C_0 \cdot (V_{152} + V_{154})$$

in which A20 and A30 are the areas of trenches 20 and 30 respectively. For a 200 nm³ droplet, this equates to a 750-fold reduction of a typical volume of an actuation gap, such that the contaminant concentration in this droplet can be expressed as $C_{max}=750 \cdot C_4$, which can quite easily equate to $4.5*10^7 \cdot C_0$ for a typical cavity volume. At such concentrations, super-saturation of the droplet is likely to occur, leading to filament formation across the first cavity region 20 by the solidification of the contaminants in the droplet.

This problem is addressed by the present invention as shown in FIG. 5. The design of the electrical isolation trench 30 is altered to reduce the concentration of contaminants in the first cavity region 20, e.g. an actuation trench or more generally a trench defined by a moving edge of the MEMS element 10 on the one side and a wall portion of the cavity on the other side. More specifically, the electrical isolation trench 30 is divided into a second cavity region 32 from which the first cavity region 20 extends and a third cavity region 34 that is separated from the second cavity region 32 by a narrow channel 36.

The narrow channel 36 may be located in a part of the trench 30 that is located between unreleased parts of the active material layer 120, or at least preferably is not located in a part of the trench 30 adjacent to the MEMS element 10, as this could increase the parasitic capacitance between the MEMS element 10 and its surroundings as well as encourage filament formation between the MEMS element 10 and its surroundings across the narrow channel 36. Consequently, the third cavity region 34 of the trench 30 is also located away from the MEMS element 10.

By locating the narrow channel 36 away from the MEMS element 10, e.g. in between the unreleased region 12 and a boundary section of the cavity 160, filament formation is not necessarily suppressed but is at least shifted to a part of the MEMS that is insensitive to such filament formation, i.e. where filament formation has no detrimental impact on the behaviour of the MEMS element 10, as the filaments are not formed on an edge of the MEMS element 10 that is arranged to be displaced relative to the opposing cavity wall portion.

In order to suppress filament formation in the first cavity region 20, the second cavity region 32 preferably has at least a section having a larger width $W_2$ than the third cavity region 34 such that the drying of the trenches in the active material layer 120 commences with void formation in, i.e. drying of, the second cavity region 32, due to the smallest capillary force in this portion. However, the presence of the narrow channel 36 acts as a pinch point that prevents the migration of the void from the second cavity region 32 into the third cavity region 34, such that the third cavity region 34 cannot start drying once the second cavity region 34 has dried. To this end, the width of the channel 36 preferably does not exceed the width of the first cavity region 20. More preferably, the width of the channel 36 is smaller than the width of the first cavity region 20.

Instead, a further second cavity region 32 is more likely to form a void and start drying following the drying of the second cavity region 32, thus leading to the drying sequence as shown in FIG. 5. Consequently, the liquid in the third cavity region 34 becomes separated from the liquid in the first cavity region 20. As the volume of the third cavity region 34 is significantly larger than the volume of the first cavity region 20, the bulk of the contaminants will be restricted to the first cavity regions 34, such that the concentration of contaminants (in the droplets formed) in the first cavity regions 20 is significantly reduced, thereby reducing the risk of filament formation in the first cavity regions 20.

Instead, due to the fact that the bulk of the contaminants is restricted to the third cavity region 34, filament formation is most likely in the narrow channels or pinch points 36. For this reason, the volume of the third cavity region 34 should be maximized whilst ensuring that the width of the third cavity region 34 is smaller than the width of the second cavity region 32 such that the drying of the trench 30, i.e., void formation, always commences in the second cavity region 32.

It is noted that the drying sequence shown in FIG. 5 is only one of a number of possible drying sequences of the trenches 20, 30 in the active material layer 120. It is however noted that the drying sequence shown in FIG. 5 is considered the worst case sequence in terms of contaminant levels in the first cavity region 20, such that other drying sequences are expected to even further reduce the contaminant levels in this gap, thus further reducing the risk of filament formation.

It is furthermore noted that the section 30 of the cavity 160 including the second cavity region 32 and the third cavity region 34 separated by a narrow channel 36 may be formed by simply amending the patterning step of the active material layer 120 as shown in step (c) of FIG. 2, which may be achieved by simply amending the pattern in the mask 130.

It should be understood that the layout shown in FIG. 5 is just one of a plethora of possible layouts that support a drying sequence in which the liquid in the first cavity region 20 becomes fluidly disconnected from the liquid in the third cavity region 34. FIG. 6 shows one such alternative, in which the third cavity region 34 does not extend between two instances of a first cavity region 20, but is disrupted instead by a section 122 of the active material layer 120. It will be apparent that the drying sequence as shown in FIG. 5 equally applies to the design in FIG. 6, as the location of the void formation is not affected by this alteration in the layout of the IC and the active material layer 120 in particular.

Yet another suitable design is shown in FIG. 7. Here, the first cavity region 20 is fluidly connected to the second cavity region 32 via a portion of the third cavity region 34, wherein the narrow trenches 36 are omitted from the design. Instead, the third cavity region 34 has a section that does not form part of the fluid path between the first cavity region 20 and the second cavity region 32. The consequence of this is demonstrated in the drying sequence shown in FIG. 7. Void formation is initiated in the second cavity region 32 because of this region having a larger width than the third cavity region 34 and the first cavity region 20. The drying process expands the void into the third cavity region 34 to the point where the void separates a first volume 34' and a second volume 34" from the first cavity region 20. The contaminants in these volumes can no longer diffuse into the first cavity region 20, thereby reducing contaminant levels in the first cavity region 20 and reducing the risk of filament formation therein.

It will be clear that in order to maximize the reduction of the contaminant levels in the first cavity region 20, the first volume 34' and the second volume 34" should be maximized in order to trap as many contaminants in these volumes as possible. This can be achieved for instance by minimizing the section of the third cavity region 34 that forms part of the fluid path from the first cavity region 20 to the second cavity region 32. A T-junction design in which the first cavity region 20 and the second cavity region 32 are aligned for instance complies with this objective.

Based on the above non-limiting examples, it should be clear that the present invention is based on the insight that a void nucleation site, i.e. the second cavity region 32, can be used to physically separate a liquid volume in the first cavity region 20 from a further and preferably much larger liquid volume in the third cavity region 34 by the expansion of the void through the fluid path from the first cavity region 20 to the second cavity region 32. By ensuring that at least a part of the third cavity region 34 lies outside this fluid path, the void expansion will fluidly disconnect this part from the first cavity region 20, thus preventing the contaminants in the isolated part of the third cavity region 34 from reaching the first cavity region 20 by diffusion. To this end, it is preferable that the majority of the volume of the third cavity region 34 lies outside this fluid path, for instance as shown in the example embodiment in FIG. 7, and it is more preferable that the entire third cavity region 34 lies outside this fluid path, for instance as shown in the example embodiments in FIGS. 5 and 6.

At this point, it is further noted that although FIG. 5 depicts an embodiment in which the arrangement of the second cavity region 32 and the third cavity region 34 are separated by a narrow channel 36 located in the same slice as the active material layer 120, it is equally feasible to form the second cavity region 32 and the third cavity region 34 separated by the narrow channel 36 out-of-plane, e.g. in which this arrangement is at least partially formed in the upper portion 164. Such an embodiment is shown in FIG. 8.

In FIG. 8, the second cavity region 32 coincides with the upper region 162 of the cavity 160. In this embodiment, the pinch channel 36 and the third cavity region 34, i.e. the contaminants collection reservoir, are located above the unreleased portion 12 of the active material layer 120, such that the pinch channel 36 and the third cavity region 34 are bound by the unreleased portion 12 on the one hand and by the capping layer 150 on the other hand. The second cavity region 32 is located at least in part over the MEMS element 10 and is in direct contact with the one or more vent holes 152 in the capping layer 150.

It is noted that in this embodiment, the width of the second cavity region 32 is not necessarily larger than the width of the third cavity region 34 because the second cavity region 32 is in direct contact with the vent hole(s) 152, such that void formation can only initiate in the second cavity region 32. In contrast the third cavity region 34 is in contact with the vent hole(s) 152 via the pinch channel 36 only, which prevents void formation in the third cavity region 34 until the remainder of the cavity 160 has dried. To this end, the pinch channel 36 should have a width that does not exceed the width of the first cavity region 20 and preferably has a smaller width than the first cavity region 20. In addition, the pinch channels 36 should have a width or height that is smaller than the width or height of the second cavity region 32 and third cavity region 34.

It is noted that FIG. 8 is not drawn to scale, and that it is preferable that the volume of the third cavity region 34 is kept as large as possible, e.g. larger than that of the second cavity region 32 to maximize the amount of contaminants trapped in the third cavity region 34 for reasons already explained above. In this embodiment, it is preferable that drying of the cavity 160 is commenced once a homogeneous contamination distribution is achieved, such that a substantial amount of the contaminants can be trapped in the second portion 34.

The IC of FIG. 8 can be made using the process steps as shown in FIG. 3, with an additional patterning of the second sacrificial material 140 to define the pinch channel 36 and the second region 34 prior to the deposition of the capping layer 150, after which the IC may be finalized as shown in FIG. 3.

In a further embodiment, shown in FIG. 9(a), the first cavity region, e.g. an actuator gap 20 comprises one or more channels 22 that extend away from the MEMS element 10. The channels 22 have a width that does not exceed the width of the first cavity region 20, and preferably have a width that is smaller than the width of the first cavity region 20 to ensure that void formation commences in the actuation first cavity region 20 rather than in the channels 22. As shown in FIG. 9(b), the trench 30 of the cavity 160 will dry first (the second cavity region 32 and third cavity region 34 are omitted from the trench 30 for the sake of clarity only), after which void formation will take place in the first cavity region 20, as shown in FIG. 9(c). The last portions to dry will be the channels 22, as shown in FIG. 9(d). This means that most of the contaminant or residue will accumulate in the channels 22, which therefore can be seen to act as a residue sink. This consequently lowers the contaminant concentration in the first cavity region 20, thereby reducing the risk of filament formation in this region.

The effect of the number of channels 22 on the residue concentration in the first cavity region 20 has been simulated. The results are shown in FIG. 10, which depicts the concentration ratio between the residue in the first cavity region 20 and the residue in the channels 22 as a function of the number of channels and the combined area $a_{sink}$ of these channels. The parameter $a_{act}$ defines the area of the first cavity region 20. This clearly demonstrates that a 10-fold reduction of the residue concentration in the first cavity region 20 can be readily achieved by the provision of such channels 22.

It is not necessary that the first cavity region 20 extends from the widest sub-section of the second cavity region 32. An example embodiment where this is not the case is shown in FIG. 11. Here, the second cavity region 32 comprises a sub-section 32' that is arranged in between the MEMS element 10 and an unreleased portion of the active material layer 120, with the first cavity region 20 extending from the narrower portion 32. The pinch channel 36 separates the third cavity region 34 of the trench 30 from the second cavity region 32, and is located away from the MEMS element 10 for the same reasons as previously explained. The sub-section 32 of the second cavity region has a width that is larger than the width of the third cavity region 34, such that void formation commences in the sub-section 32 rather than in the third cavity region 34.

In summary, the present invention provides a cavity structure in which reservoirs are provided that direct the filament formation away from the sensitive trenches separating the MEMS element 10 from its surroundings, i.e. the trenches facilitating the displacement of an edge of the MEMS element 10, thereby reducing the risk that filaments bridging such sensitive trenches and thereby affecting the dynamic behaviour of the MEMS element 10 are formed. Although the present invention has been described in terms of a capacitive resonator element 10, it should be understood that the principles of the present invention may be equally applied to any other suitable type of MEMS devices.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit comprising a MEMS (microelectromechanical system) element in a plane of the integrated circuit, the MEMS element being suspended in a cavity-over a substrate, said cavity including:
   a first cavity region in said plane spatially separating an edge of the MEMS element from a wall section of the cavity, said edge being arranged to be displaced relative to the wall section; and
   a second cavity region in said plane forming part of a fluid path further including the first cavity region, said fluid path defining a first volume; and
   a third cavity region in said plane defining a second volume in fluid connection with the second cavity region, wherein the maximum width of the second cavity region is larger than the maximum width of the third cavity region, the second and third cavity regions having maximum widths that are larger than the maximum width of the first cavity region, and wherein at least a part of the second volume is excluded from the fluid path.

2. The integrated circuit of claim 1, wherein the plane coincides with a patterned material layer in which the MEMS element is formed.

3. The integrated circuit of claim 1 or 2, wherein the second volume is larger than the first volume.

4. The integrated circuit of claim 1, wherein the majority of the second volume is excluded from the fluid path.

5. The integrated circuit of claim 1, wherein the second volume is excluded from the fluid path.

6. The integrated circuit of claim 5, wherein the first cavity region extends from the second cavity region, and wherein the third cavity region is fluidly connected to the second cavity region via a channel portion having a width not exceeding the width of the first cavity region.

7. The integrated circuit of claim 5, wherein the integrated circuit further comprises a capping layer, and wherein the cavity further comprises a first further region in between the plane and the substrate and a second further region in between the plane and the capping layer.

8. The integrated circuit of any of claim 1, further comprising a plurality of channels in said plane extending from the first cavity region into the wall section, each of said channels having a channel width that does not exceed the width of the first cavity region.

9. An integrated circuit comprising:
a MEMS (microelectromechanical system) element formed in a material layer over a substrate and being suspended in a cavity;
a capping layer over the cavity, said capping layer comprising a plugged opening;
wherein the cavity comprises:
a first cavity region spatially separating an edge of the MEMS element from a wall section of the cavity, said edge being arranged to be displaced relative to the wall section;
a first further region in between the MEMS element and the substrate; and
a second further region located in part in between the MEMS element and the capping layer, said second further region comprising:
a first section in between the MEMS element and a part of the capping layer including the plugged opening; and
a second section in between an unreleased portion of the material layer and a further part of the capping layer not including a plugged vent hole, wherein the first section is separated from the second section by a channel portion having a width not exceeding the maximum width of the first cavity region.

10. The integrated circuit of claim 9, wherein the volume of the second section is larger than the volume of the first section.

11. A method of manufacturing an integrated circuit comprising a MEMS element suspended in a cavity, the method comprising:
providing a first sacrificial material layer on a substrate;
providing an active material layer on the first sacrificial material layer;
patterning the active material layer to form the MEMS element, a first cavity region spatially separating an edge of the MEMS element from a wall section of the cavity, said edge being arranged to be displaced relative to the wall section; a second cavity region forming part of a fluid path further including the first cavity region, said fluid path defining a first volume; and a third cavity region defining a second volume in fluid connection with the second cavity region, wherein the maximum width of the second cavity portion is larger than the maximum width of the third cavity regions, the second and third cavity regions having maximum widths that are larger than the maximum width of the first cavity region, and wherein at least a part of the second volume is excluded from the fluid path;
forming a part of the cavity by partially removing the first sacrificial material layer through the patterned active material layer using a first etch recipe;
forming a second sacrificial material layer over the patterned active material layer;
forming a capping layer over the second sacrificial material layer, said capping layer comprises at least one opening; and
completing said cavity by removing the second sacrificial material layer through the at least one opening using a wet etch recipe.

12. A method of manufacturing an integrated circuit comprising a MEMS element suspended in a cavity, the method comprising:
providing a first sacrificial material layer;
providing an active material layer on the first sacrificial material layer;
patterning the active material layer to form the MEMS element, a first cavity region spatially separating an edge of the MEMS element from a wall section of the cavity, said edge being arranged to be displaced relative to the wall section;
forming a part of the cavity by partially removing the first sacrificial material layer through the patterned active material layer using a first etch recipe;
forming a second sacrificial material layer over the patterned active material layer;
patterning the second sacrificial material layer to define a first section on the MEMS element, a second section on an unreleased portion of the material layer and a channel portion connecting the first section to the second section, the channel portion having a thickness not exceeding the maximum width of the first cavity region;
forming a capping layer over the second sacrificial material layer, said capping layer comprises at least one opening over the first section;
completing said cavity by removing the second sacrificial material layer through the at least one opening using a wet etch recipe.

13. The method of claim 12, wherein the patterning step further comprises defining a plurality of channels extending from the first cavity region into said wall section, each of said channels having a channel width that does not exceed the maximum width of the first cavity region.

14. The method of claim 12, wherein the second section has a larger volume than the first section.

15. The method of any of claim 12, wherein the active material layer comprises a silicon layer.

* * * * *